(12) United States Patent
Muniandy et al.

(10) Patent No.: US 9,064,718 B1
(45) Date of Patent: Jun. 23, 2015

(54) PRE-FORMED VIA ARRAY FOR INTEGRATED CIRCUIT PACKAGE

(71) Applicants: Kesvakumar V. C. Muniandy, Klang (MY); Navas Khan Oratti Kalandar, Petaling Jaya (MY)

(72) Inventors: Kesvakumar V. C. Muniandy, Klang (MY); Navas Khan Oratti Kalandar, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/271,469

(22) Filed: May 7, 2014

(51) Int. Cl.
*H01L 21/44* (2006.01)
*H01L 25/065* (2006.01)
*H01L 21/768* (2006.01)
*H01L 23/48* (2006.01)
*H01L 21/56* (2006.01)
*H01L 23/31* (2006.01)
*H01L 25/00* (2006.01)
*H01L 23/00* (2006.01)

(52) U.S. Cl.
CPC .......... *H01L 25/0657* (2013.01); *H01L 21/768* (2013.01); *H01L 23/481* (2013.01); *H01L 21/76895* (2013.01); *H01L 21/56* (2013.01); *H01L 23/3114* (2013.01); *H01L 25/50* (2013.01); *H01L 24/83* (2013.01); *H01L 2225/0651* (2013.01); *H01L 2225/06548* (2013.01); *H01L 2224/83203* (2013.01); *H01L 2224/83205* (2013.01); *H01L 2924/14* (2013.01); *H01L 2924/01028* (2013.01); *H01L 2924/01079* (2013.01); *H01L 2924/01047* (2013.01); *H01L 2924/014* (2013.01); *H01L 2224/83801* (2013.01)

(58) Field of Classification Search
CPC ... H01L 21/486; H01L 21/568; H01L 23/481; H01L 23/49827; H01L 23/49861; H01L 23/5384
USPC .......................... 438/667; 257/668, 698, 774
See application file for complete search history.

(56) References Cited

U.S. PATENT DOCUMENTS

| | | | |
|---|---|---|---|
| 5,268,072 A * | 12/1993 | Agarwala et al. | 216/13 |
| 7,550,680 B2 | 6/2009 | Pendse | |
| 8,035,235 B2 | 10/2011 | Jang | |
| 8,546,932 B1 | 10/2013 | Chung | |
| 2007/0069389 A1 | 3/2007 | Wollanke | |
| 2011/0018119 A1* | 1/2011 | Kim et al. | 257/690 |
| 2011/0068481 A1 | 3/2011 | Park | |
| 2014/0175671 A1* | 6/2014 | Haba et al. | 257/777 |
| 2015/0041987 A1* | 2/2015 | Yew et al. | 257/774 |

FOREIGN PATENT DOCUMENTS

CN 102064162 1/2013

* cited by examiner

*Primary Examiner* — Tu-Tu Ho
(74) *Attorney, Agent, or Firm* — Charles Bergere

(57) ABSTRACT

A method for assembling a 3D integrated circuit package that includes a base device and a top device. The method includes bonding (i) a pre-formed via array having a via rack and via elements and (ii) a base die to the substrate of the base device. The resulting sub-assembly is encapsulated in molding compound, and the via rack and any corresponding molding compound are removed, such as by grinding, to generate a base device with vias corresponding to the via elements and exposed bond posts on its top surface corresponding to the tops of the vias. A pre-packaged or unpackaged top device is then attached and bonded to the base device and, if necessary, encapsulated to form the 3D package with the exposed tops of the vias providing electrical connections between the base substrate and the top device.

18 Claims, 6 Drawing Sheets

PRE-FORMED VIA ARRAY FOR INTEGRATED CIRCUIT PACKAGE

BACKGROUND OF THE INVENTION

The present invention relates to integrated circuit (IC) packaging and, more particularly, to a pre-formed via array for an IC package.

Conventional three-dimensional (3D) packaging refers to the assembly of a vertically stacked package from a bottom IC device to a top IC device, where at least the bottom device is already encapsulated before being stacked with the top device. The term device, as used herein, refers to an object including an IC die, where the object may be, for example, just the die, a sub-assembly of the die and a leadframe or substrate, or a chip comprising the die after packaging. Note that, as used herein, chip refers to a packaged die. 3D package types include, for example, package-on-package (POP) and chip-scale package (CSP) types. POP 3D packaging involves assembling two already packaged devices, whereas CSP-type packaging involves manufacturing or assembling the top device on top of an already packaged bottom device.

One typical 3D package combines a logic chip with a memory chip. 3D packages allow for more-compact integration and board placement of IC systems, since the component devices of a 3D package are already interconnected before mounting on a printed circuit board (PCB), and the footprint of the 3D package is only as large as its bottom-most component—rather than the sum of the footprints of the individual components and necessary interconnects between or among them.

Furthermore, 3D packages allow for greater flexibility in combining devices than, for example, stacked-die packages, in which two or more unpackaged dies are stacked on a single substrate to form a sub-assembly that is then encapsulated to form a single package. One example of the combinational flexibility of 3D packages is the ability to combine in a 3D package a single type of processor chip with any one of multiple types of memory chips, which may vary by, for example, capacity or manufacturer. 3D package assembly also allows for individual testing of chips prior to assembly to avoid assembling a failed or damaged chip with a good chip and thereby needlessly wasting the good chip.

FIGS. 1A-1D illustrate steps in the assembly of a conventional 3D POP package 100 (FIG. 1D). The package 100 comprises a base chip 101 and a top chip 102. Note that the substrate of the base chip may be referred to herein as the base substrate.

FIG. 1A shows the base chip 101 comprising die 103 attached and electrically connected to base substrate 104 and encapsulated in molding compound 107. The base substrate 104 includes bond posts—such as exemplary bond post 105(1), shown electrically connected to the die 103 with bond wires, and bond posts, such as exemplary bond post 106(1), for connections to the top chip 102. Note that the bond posts 106 for connections to the top chip 102 are referred to herein as through-mold bond posts. The bond posts 105 and 106 are conductively connected to pad connectors (not shown) on the bottom of the base substrate 104. The pad connectors are used to electrically connect the chips 101, 102 of the package 100 to a PCB.

FIG. 1B shows the base chip 101 after the excavation of via wells, such as exemplary well 108(1). The via wells 108 may be excavated using lasers, drills, or etching materials to remove a truncated cone of the molding compound 107 down to corresponding through-mold bond posts 106.

FIG. 1C shows base chip 101 of FIG. 1B after the via wells 108 are filled with metal to form through-mold vias (TMV) such as exemplary TMV 109(1), which conductively connects to the bond post 106(1). The via wells 108 may be filled, for example, using a conductive paste.

FIG. 1D shows the 3D package 100 comprising the base chip 101 of FIG. 1C following attachment of the top chip 102 on the top surface of the base chip 101, and bonding of conductive balls—such as exemplary conductive ball 111(1)—to the contact pads (not shown) on the bottom surface of the base substrate 104. The top chip 102 comprises a die 112 attached and electrically connected to substrate 113 (e.g., as a flip-chip) and encapsulated in a molding compound 114. The top chip 102 is ball bonded to the base chip 101 using conductive balls such as exemplary conductive ball 115(1).

The assembly process illustrated in FIGS. 1A-1D and described above may be expensive and time consuming.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not necessarily drawn to scale.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In some embodiments of the invention, a 3D package is assembled using a pre-formed via array in the base device instead of excavating and filing wells. Specifically, prior to encapsulation of the base device, the pre-formed via array is physically and conductively connected to through-mold bond posts of the base substrate.

One embodiment of the invention is a method for assembling a 3D integrated circuit package that includes (i) a base device and (ii) a top device. The method includes bonding (i) a pre-formed via array having a via rack and a plurality of via elements and (ii) a base die to the substrate of the base device. The resulting sub-assembly is encapsulated in molding compound, and the via rack and any corresponding molding compound are removed, such as by grinding, to generate a base device with exposed bond posts on its top surface corresponding to the tops of vias in the molding compound, where the vias correspond to the via elements of the via array. A pre-packaged or unpackaged top device is then attached and bonded to the base device and, if necessary, encapsulated to form the 3D package with the exposed tops of the vias providing electrical connections between the base substrate and the top device.

Figure 1A:
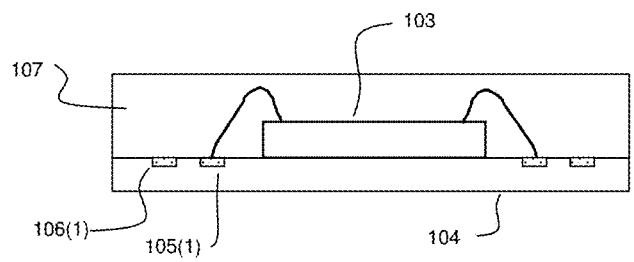
FIG. 1A shows a side cross-sectional view of a base device for a conventional package-on-package assembly.
Figure 1B:
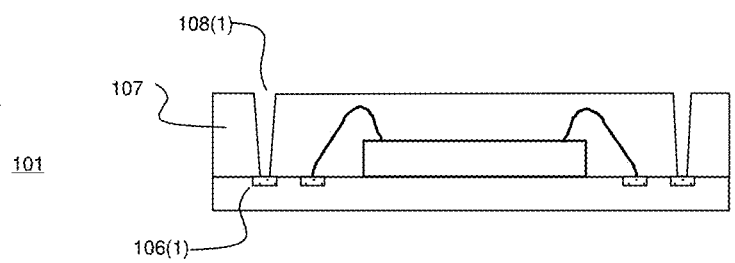
FIG. 1B shows a side cross-sectional view of the base device of FIG. 1A after the excavation of via wells.
Figure 1C:
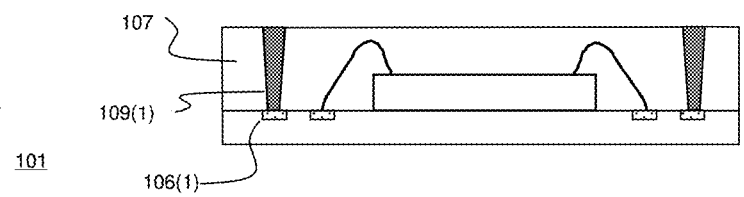
FIG. 1C shows a side cross-sectional view of the base device of FIG. 1B after the via wells have been filled with metal to form through-mold vias.
Figure 1D:
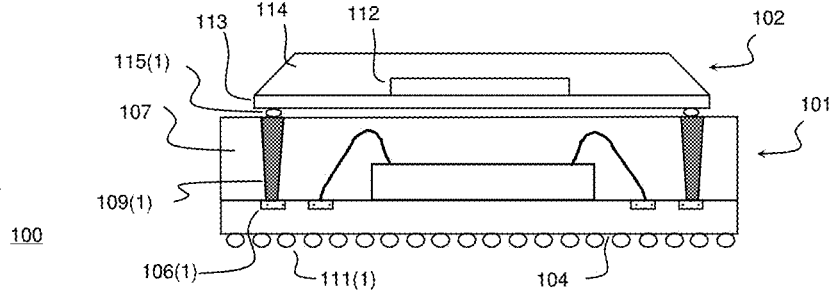
FIG. 1D shows a side cross-sectional view of a conventional 3D package including the base device of FIG. 1C and a top device on the top surface of the base device.
Figure 2:
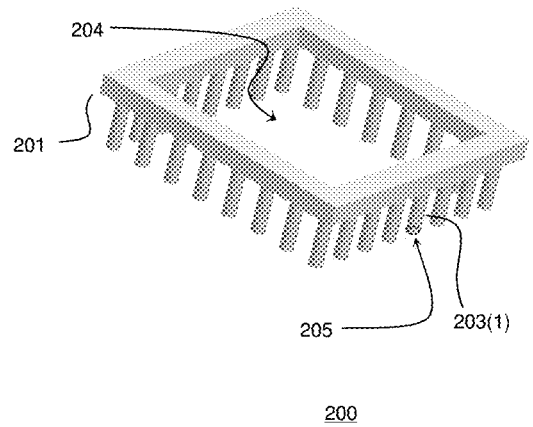
FIG. 2 shows a perspective view of a via array in accordance with one embodiment of the present invention.

Referring now to FIG. 2, a perspective view of a pre-formed via array 200 in accordance with one embodiment of the invention is shown. The via array 200 comprises via rack 201 and a plurality of via elements, such as exemplary via element 203(1). The via rack 201 is a planar, rectangular ring that holds in place the via elements 203 and has a rectangular opening 204. The via rack 201 is at the top of the via elements 203, where the top of a via element refers to the end distal from the end adapted for bonding to through-mold bond posts of a base substrate.

The via elements 203 are substantially cylindrical, parallel to each other along their longitudinal axes, and perpendicular to the plane of the via rack 201. The via array 200 may be manufactured as a single metal piece by, for example, casting or machining. Casting refers to the process of pouring liquid metal into a mold to generate the desired form. Machining refers to removing material from a solid metal block to leave behind the desired form, such as by milling.

The via rack and the via elements 203 may be, for example, made of copper or a copper alloy. The via elements 203 may further be partially or fully coated with one or more finishing materials. For example, the bottom 205 of the via element of via 203(1) may have a nickel metal finish for improved connection to their corresponding bond posts. Note that other wettable metals, in other words, metals that bond well with solder, may be also be used as a finish for the via bottoms 205. Wettable metals include, for example, nickel, silver, gold, and solder itself.

Figure 3:
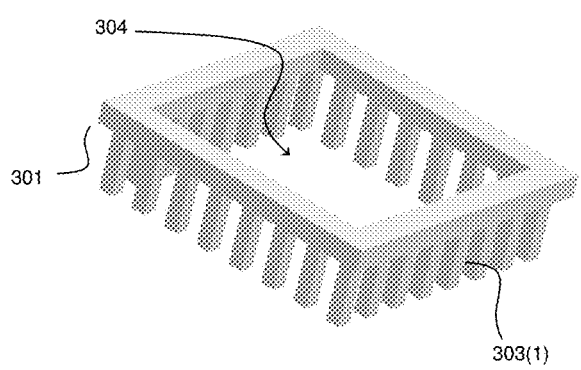
FIG. 3 shows a perspective view of a via array in accordance with another embodiment of the present invention.

FIG. 3 shows a perspective view of via array 300 in accordance with another embodiment of the invention. The via array 300 comprises a via rack 301 and a plurality of via elements such as exemplary via element 303(1). The via rack 301 is a planar, rectangular ring that holds together via elements 303 and has a rectangular opening 304. The via elements 303 are substantially right rectangular prisms parallel to each other along their longitudinal axes and perpendicular to the plane of the via rack 301. The via array 300 and its components may be manufactured and finished in ways similar to those described above in reference to the via array 200 of FIG. 2.

Note that the via elements and via rack of a pre-formed via array may be pre-formed together as a unitary piece. The via array elements are elongated solids that may also resemble, for example, other types of prisms or truncated cones. After the bonding of the via array to the base substrate, the via array is encapsulated in molding compound together with the top of the base substrate and an already wire-bonded or ball-bonded die.

Encapsulation may be performed by, for example, using liquid encapsulation or compression molding. Liquid encapsulation typically includes injecting liquid encapsulant into a mold, curing the encapsulant, and then trimming the cured encapsulant. Compression molding uses heat and pressure to cure a flexible encapsulant. Note also that, typically, the die is wire-bonded or ball-bonded to the base substrate before the attachment of the via array. However, the die may alternatively be wire-bonded or ball-bonded after attachment of the via array.

After encapsulation of the sub-assembly comprising the die, via array, and substrate, the top of the encapsulated sub-assembly, including the via rack, is ground away, or otherwise removed, leaving a sub-assembly comprising the die, molding compound, and vias. The sub-assembly has a top surface comprising molding compound and via tops, where the via tops function as bond posts for the top device. Using the via array avoids the need for excavating and filling via wells in cured molding compound.

Figure 4A:
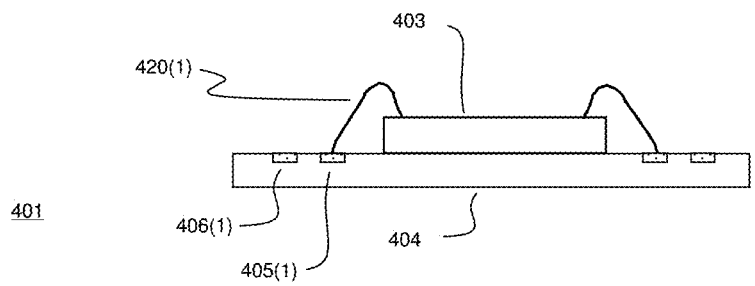
FIG. 4A shows a simplified cross-sectional view of a sub-assembly in accordance with one embodiment of the present invention.

FIG. 4A shows a simplified cross-sectional view of a sub-assembly 401 in accordance with one embodiment of the present invention. The sub-assembly 401 comprises a die 403 mounted on a substrate 404. Note that the figures omit certain details such as, for example, (1) die-attach material that may adhere the die 403 to the substrate 404, (2) vias through the substrate 404, and (3) substrate pads on the bottom side of the substrate 404, which are adapted to electrically connect the sub-assembly 401 to a PCB or another component. The substrate pads may be, for example, openings for attaching solder balls, openings for pins on a corresponding receptacle, or pins for a corresponding socket.

The top side of the substrate 404 comprises a plurality of substrate bonding pads for connecting to the die 403, such as exemplary substrate bonding pad 405(1). Die bond pads (not shown) on the die 403 are electrically connected to corresponding substrate bonding pads 405 using bond wires, such as exemplary bond wire 420(1), which connects substrate bonding pad 405(1) to a corresponding bond pad (not shown) on the die 403. The top side of the substrate 404 further comprises a plurality of metal through-mold bond posts, such as exemplary through-mold bond post 406(1). Note that substrate bonding pads 405 and through-mold bond posts 406 conductively connect to corresponding pad connectors (not shown) on the bottom surface of the substrate 404 through vias (not shown) in the substrate 404. The pad connectors may be organized as two sets—a first set of pad connectors that connect to the substrate bonding pads 405, which may be considered the base die's bonding pads, and a second set of pad connectors that connect to through-mold bond posts 406.

Figure 4B:
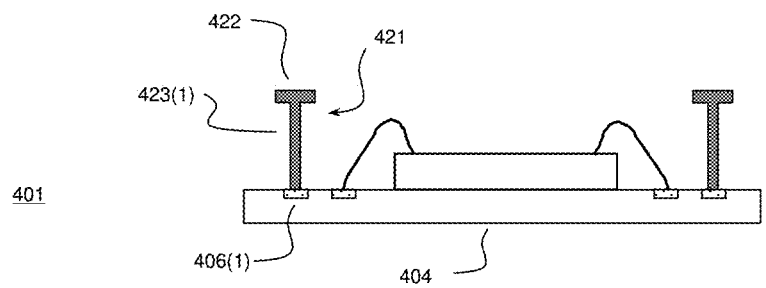
FIG. 4B shows a simplified cross-sectional view of the sub-assembly of FIG. 4A after the bonding of a preformed via array.

FIG. 4B shows a simplified cross-sectional view of the sub-assembly 401 of FIG. 4A after attachment of a preformed via array 421. The via array 421 may be in form of, for example, the via array 200 of FIG. 2 or the via array 300 of FIG. 3. The via array 421 includes a via rack 422 and a plurality of via elements, such as exemplary via element 423(1), which is bonded to the through-mold bond post 406(1). Because FIG. 4B is a cross-sectional view, only part of the via rack 422 and only two of the via elements are visible in FIG. 4B. The via array 421 may be bonded or attached to the substrate 404 using, for example, thermo-compression bonding (TCB) or ultrasonic bonding. Note that thermo-compression bonding may use anisotropic conductive film (ACF) between the bottoms of the via elements 423 and the substrate 404 for improved bonding. The bonding of the via array 421 may also include the use of solder between the bottoms of the via elements 423 and the corresponding through-mold bond posts 406.

Figure 4C:
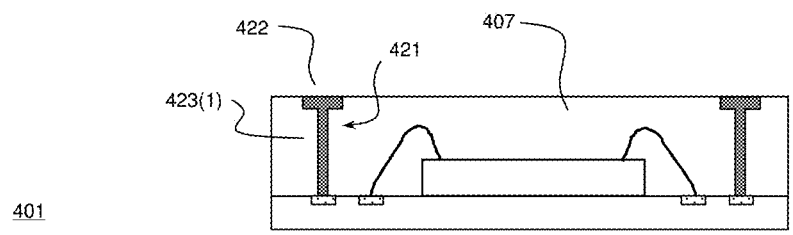
FIG. 4C shows a simplified cross-sectional view of the sub-assembly of FIG. 4B after encapsulation with molding compound.

FIG. 4C shows a simplified cross-sectional view of the sub-assembly 401 of FIG. 4B after encapsulation with molding compound 407. Note that, although FIG. 4C shows the top of the molding compound 407 level with the top of the via rack 422, the top of the molding compound 407 may be higher or lower than the top of the via rack 422 so long as the molding compound 407 covers a sufficient portion of the via elements 423 of the via array 421 to allow making a base device 430 as shown in FIG. 4D.

Figure 4D:
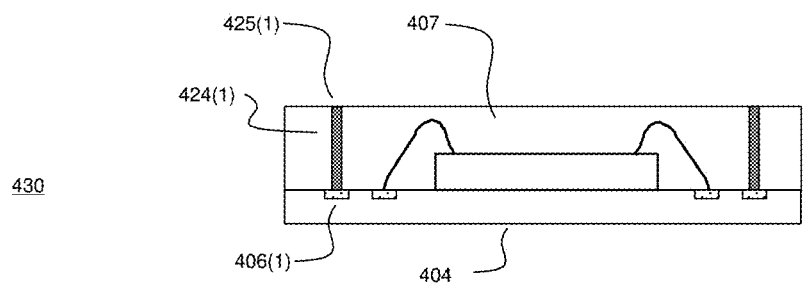
FIG. 4D shows a simplified cross-sectional view of a base device formed from the sub-assembly of FIG. 4C.

FIG. 4D shows a simplified cross-sectional view of pre-packaged base device 430, which was formed from the sub-assembly 401 of FIG. 4C by the removal of the via rack 422 and any corresponding portion of the molding compound 407 by, for example, grinding off the top of the sub-assembly 401. Note that top portions of the via elements 423 may also be removed. After removal of the via rack 422, vias 424, such as exemplary via 424(1), remain from corresponding via elements 423. The base device 430 is ready for further assembly in accordance with any compatible 3D packaging technology, such as, for example, POP or CSP. The tops 425 of the vias 424 are exposed and ready to serve as bond posts for a top device. For example, the top 425(1) of the via 424(1), which connects to through-mold bond post 406(1), is ready to serve as a bond post for a top device. Note that the tops of the vias 424 may be coated or otherwise treated prior to the attachment of the top device for better bonding with the top device.

Figure 5:
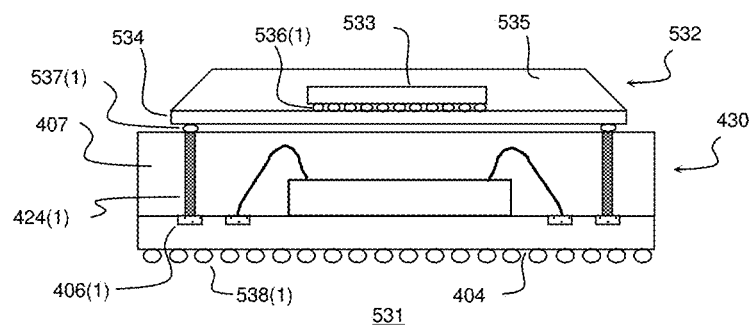
FIG. 5 shows a simplified cross-sectional view of a package-on-package (POP) 3D-package assembly in accordance with one embodiment of the present invention, which includes the base device of FIG. 4D and a top device.

FIG. 5 shows a simplified cross-sectional view of package-on-package (POP) 3D-package assembly 531 in accordance with one embodiment of the invention, which includes the pre-packaged base device 430 of FIG. 4D and a pre-packaged top device 532, which in this embodiment is a flip chip. The top device 532 comprises a die 533 mounted on the top surface of a substrate 534 and encapsulated in a molding compound 535. The die 533 is ball bonded to bond posts (not shown) on the top surface of the substrate 534 using bonding balls such as exemplary bonding ball 536(1). Note that underfill used between the die 533 and the substrate 534 is not shown. The bond posts on the top surface of the substrate 534 conductively connect to contact pads (not shown) on the bottom surface of the substrate 534 with metal vias (not shown) through the substrate 534, as is known in the art. Note that, in an alternative embodiment, the die 533 of top device 532 may be electrically connected to the bond posts of the substrate 534 with bond wires.

The top device 532 is ball-bonded to the base device 430 with bonding balls such as exemplary bonding ball 537(1), which connects the via 424(1) of the base device 430 to a corresponding connection pad (not shown) on the bottom surface of the substrate 534 of the top device 532. The assembly 531 further comprises bonding balls, such as exemplary bonding ball 538(1), bonded to the bottom surface of the substrate 404 of the base device 430 for mounting the assembly 531 on a PCB or other system. The bonding balls 538 may be bonded to the base device 430 before or after bonding the top device 532 to the base device 430. Bonding balls, such as the bonding balls 536, 537 and 538 are formed of a conductive metal (either solid or plated) and sized and shaped to allow for interconnection between various devices, such as between a die and a substrate or between two substrates. Such bonding balls are well known by those of skill in the art so further description is not necessary.

Figure 6:
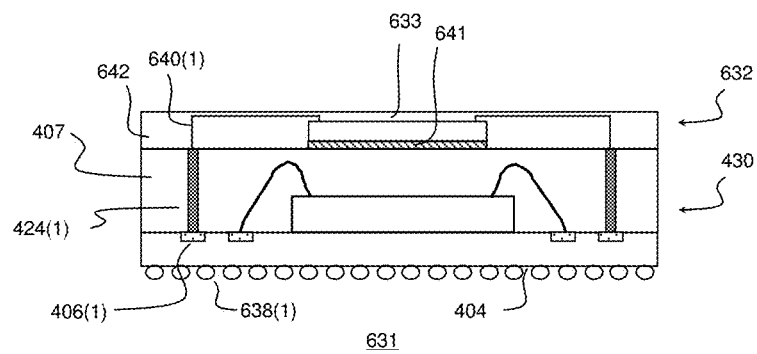
FIG. 6 shows a simplified cross-sectional view of a chip-scale package (CSP) assembly in accordance with another embodiment of the present invention, which includes the base device of FIG. 4D and a top device.

FIG. 6 shows a simplified cross-sectional view of a chip-scale package (CSP) assembly 631 in accordance with another embodiment of the invention, which includes the pre-packaged base device 430 of FIG. 4D and a top device 632. In this embodiment, the top device 632 is mounted on top of the base device 430 using thin-film technology. In particular, an unpackaged die 633 is attached to the top of the base device 430 using a die-attach film or paste 641 and conductively connected to the vias 424 using conductive paths like path 640(1), which (i) connects the via 424(1) in the base device 430 to a corresponding bond pad (not shown) on the die 633 of the top device 632 and (ii) runs through encapsulant 642.

The encapsulant 642 is an IC dielectric material, such as silicon dioxide or silicon nitride. The encapsulant 642 and conductive paths 640 are formed using conventional photo-lithographic thin-film technologies. In other words, a dielectric layer is deposited over the die 633 and exposed areas of the top of the base device 430. Then vias are etched and filled over bond pads on the die 633 and the tops of the vias 424. Then conductive traces using, e.g., copper are formed between corresponding via 424 and the bond pads of the die 633.

Note that the conductive traces may be formed as part of an IC redistribution layer (RDL). An IC RDL refers to a collection of IC assembly layers that redistribute bond-pad connections on a chip by connecting pads in a first set of locations at a first layer, e.g., tightly spaced bond pads on a die, to pads in a different set of locations at a second layer, e.g., more-loosely spaced bond posts on a corresponding substrate. The redistribution layer is then covered with another dielectric layer. Note that, in some implementations, the second dielectric layer may have a different composition than the first dielectric layer.

The assembly 631 further comprises bonding balls, such as exemplary bonding ball 638(1) bonded to the bottom surface of the substrate 404 of the base device 430 for mounting the assembly 631 on a PCB or other system. The bonding balls 638 may be bonded to the base device 430 either before or after the assembly of the top device 632 on top of the base device 430.

Figure 7:
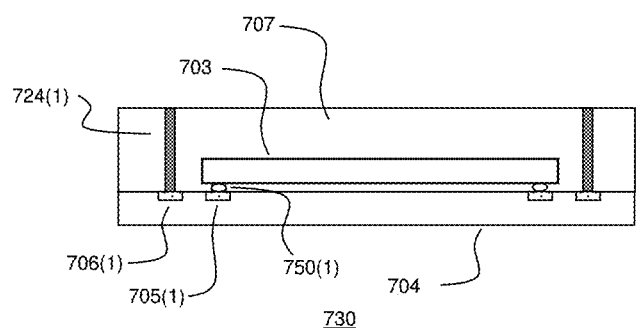
FIG. 7 shows a simplified cross-sectional view of a base device in accordance with an alternative embodiment of the present invention.

FIG. 7 shows a simplified cross-sectional view of a pre-packaged base device 730 in accordance with an alternative embodiment of the invention. Elements of the device 730 similar to corresponding elements of the device 430 of FIG. 4D are similarly labeled, but with a different prefix, such as, for example, molding compound 707, via 724(1), through-mold bond post 706(1), and base-die bond post 705(1). The pre-packaged base device 730 is analogous to the pre-packaged base device 430 of FIG. 4D, except that, in device 730, the die 703 is a flip chip die that is connected to the substrate 704 with bonding balls 750 rather than with bond wires as in the base device 430. The device 730 may be used as a base device in place of the device 430 in, for example, the assembly 531 of FIG. 5 or the assembly 631 of FIG. 6.

Figure 8:
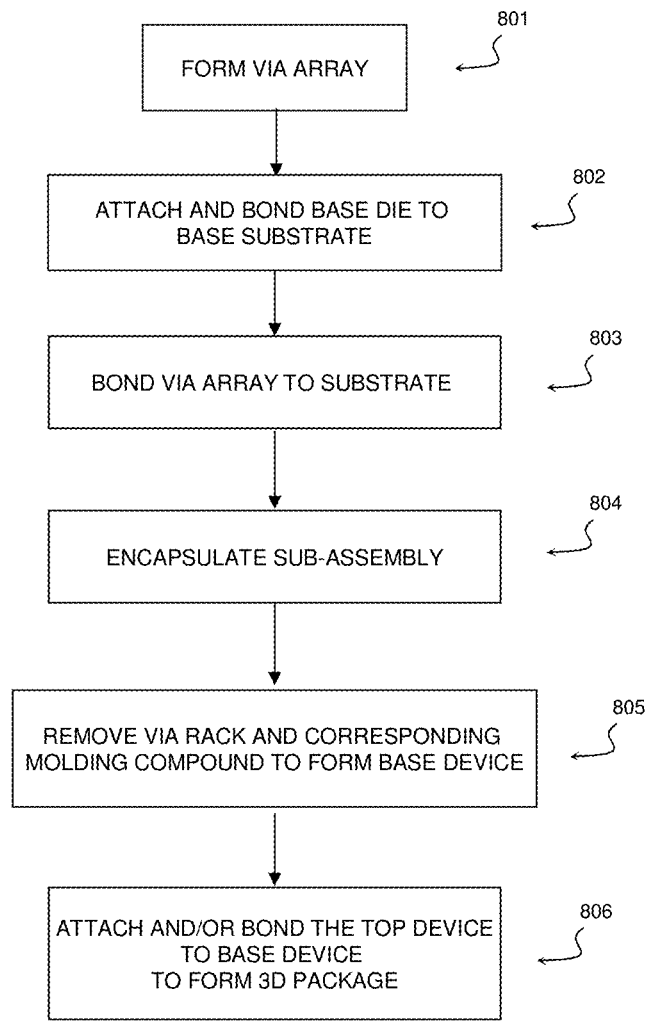
FIG. 8 is a flow chart of a method of assembling a 3D package in accordance with one embodiment of the present invention.

FIG. 8 is a flow chart of a process 800 in accordance with one embodiment of the invention. The process 800 starts with forming a via array (step 801). Then a die is attached and electrically connected to a substrate (step 802) and the via array is bonded to the substrate (step 803). Note that steps 802 and 803 may be performed in reverse order. After the via array and die are bonded to the substrate, the sub-assembly is encapsulated in a molding compound (step 804). After encapsulation, the via rack and any corresponding molding compound are removed, thereby forming a pre-packaged base device (step 805). Next, a pre-packaged or unpackaged top device is attached and/or bonded to the pre-packaged base device and, if necessary, encapsulated to form a completed 3D package (step 806) that is ready for mounting on a PCB.

Figure 9A:
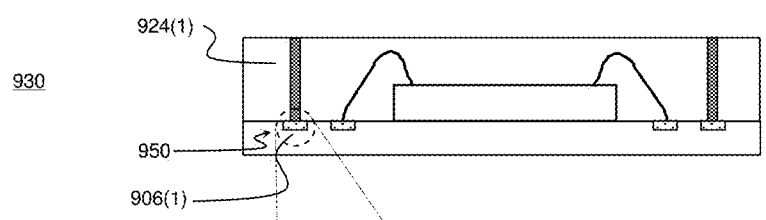
FIG. 9A shows a simplified cross-sectional view of a base device in accordance with an embodiment of the present invention.

FIG. 9A shows a simplified cross-sectional view of base device 930, in accordance with an embodiment of the present invention. The base device 930 is substantially similar to the base device 430 of FIG. 4 and corresponding elements are either (1) similarly labeled, but with a different prefix or (2) unlabeled. Detail area 950 includes the junction of an exemplary via 924(1) and an exemplary thorough-mold bond post 906(1).

Figure 9B:
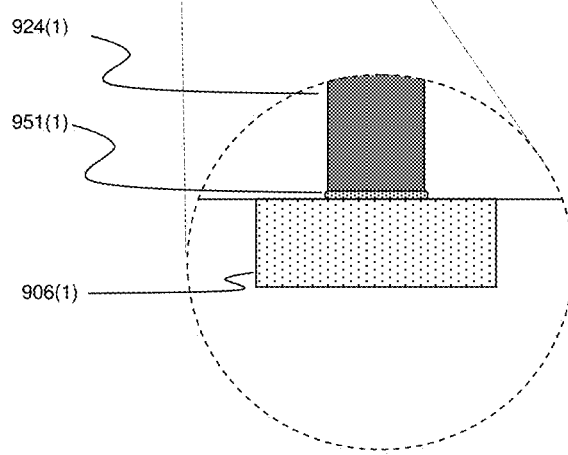
FIG. 9B shows an enlargement of a detail area of FIG. 9A.

FIG. 9B shows an enlargement of detail area 950 of FIG. 9A. Detail area 950 shows an exemplary intermediary conductor 951(1), which comprises a material different from the material of vias 924. The intermediary conductor 951(1) may comprise one or more of the above-descried finishing materials such as nickel, silver, gold, solder or electrically conductive epoxy.

Embodiments of the invention have been described where the base device is adapted for mounting on a PCB. The invention is not so limited. In alternative embodiments, the base device is adapted for mounting on different components such as, for example, a socket, another IC device, or any other component.

Embodiments of the invention have been described where the via array is manufactured by casting or machining. In alternative embodiments, different methods for manufacturing a via array are used. In some alternative embodiments, the via array is formed by first making a strip comprising via elements attached to a linear via rack and then bending the strip at three or four locations within the plane of the rack to form the via array, where the planar, bent via rack has a substantially rectangular shape having a gap between two adjacent, unconnected sides. If the gap in the via rack is at a vertex, then three orthogonal bends may be used. If the gap is on a side of the via rack, then four orthogonal bends may be used. Note that this method may also be used to generate a full-connected, rectangular via rack by, for example, crimping, soldering, or otherwise closing the gap.

An embodiment of the invention has been described where the 3D package 631 of FIG. 6 is formed by assembling a top device on top of a pre-packaged bottom device using thin-film technology. In an alternative embodiment, a top device is assembled on top of a pre-packaged bottom device and electrically connected to the bottom device using bond wires.

Embodiments of the invention have been described where the via elements and via rack are manufactured as a single unitary structure of a single material. In some alternative embodiments, the via elements and via rack are made separately and then joined together. In some alternative embodiments, the via rack is made of a material different from the via elements. In some of those alternative embodiments, the via rack is made of a non-metallic material.

Embodiments of the invention have been described where the via array forms a single contiguous piece. In some alternative embodiments, the via array may comprise two or more non-contiguous pieces, each comprising some of the via elements and a segment of the via rack of the via array.

Embodiments of the invention have been described where a 3D package comprises a base device and a top device. The invention, however, is not limited to 3D packages comprising only two devices. In alternative embodiments, 3D packages may comprise three or more vertically stacked devices, where one or more intermediate devices are connected between a bottommost base device and a topmost top device. Each intermediate device functions as a base device to the device above it and as a top device to the device below it. Note that assembly of devices below the top two levels of greater-than-three-devices 3D packages may comprise use of additional nested or nesting via arrays to separately conduct signals from upper devices to the substrate of the bottommost base device. Alternatively, a plurality of devices may share one or more via arrays of intermediary and/or base devices.

Embodiments of the invention have been described where the base device comprises an IC die bonded to the base substrate. In some alternative embodiments, a base die is attached but not electrically bonded to the substrate. In some alternative embodiments, the base device does not include a base die. These alternative embodiments may be useful, for example, for testing purposes, to form an adapter between a top device and a PCB, or to assemble a package of particular larger dimensions from a smaller top device.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A method for assembling an integrated circuit (IC) package, the method comprising:
   (a) bonding a via array to a base substrate, wherein:
      the via array comprises a plurality of via elements that project from a via rack;
      the via elements are electrical conductors held together by the via rack;
      each via element comprises a via; and
      bottoms of the via elements are bonded to corresponding through-mold bond pads on a top surface of the base substrate;
   (b) encapsulating the via array and the top surface of the base substrate in molding compound, wherein at least a portion of each via element is encapsulated; and
   (c) removing the via rack to form a packaged base device having a top surface and comprising the base substrate, the vias, and the molding compound, wherein the top surface of the packaged base device comprises top sides of the vias and a top side of the molding compound.

2. The method of claim 1, wherein:
   each via element further comprises a top portion located above the via;
   step (c) further comprises removing the top portions of the via elements and leaving the vias.

3. The method of claim 1, wherein:
   step (c) further comprises removing a top portion of the molding compound; and
   the top side of the molding compound is a top side of the post-removing-step molding compound.

4. The method of claim 1, step (a) further comprises:
   attaching a base IC die to the base substrate; and
   electrically connecting the base die to corresponding bond pads on the base substrate, wherein step (b) further comprises encapsulating the base die.

5. The method of claim 4, wherein:
   the base substrate has a bottom surface opposite from the top surface;
   the base substrate comprises first and second sets of pad connectors adapted to electrically connect the package to another component;
   each pad connector of the first set is conductively connected to a corresponding through-mold bond post; and
   each pad connector of the second set is conductively connected to a corresponding base-die bond post.

6. The method of claim 1, wherein:
   the via rack is a planar rectangular ring;
   the via rack has a central rectangular opening; and
   the via rack holds the via elements in place.

7. The method of claim 6, wherein the via elements are parallel to each other along their longitudinal axes and perpendicular to the plane of the rack.

8. The method of claim 6, wherein the via rack is an open planar rectangular ring having a gap.

9. The method of claim 1, wherein the via array is preformed as a single unitary metal piece.

10. The method of claim 1, wherein:
    each via element has a bottom;
    prior to step (a), the bottoms of the via elements are coated with a finishing material.

11. The method of claim 10, wherein the finishing material comprises at least one of nickel, silver, gold, and solder.

12. The method of claim 1, wherein step (a) comprises one of thermo-compression bonding and ultrasonic bonding.

13. The method of claim 12, wherein step (a) comprises using at least one of a solder and an anisotropic conductive film between the via elements and the corresponding through-mold bond posts.

14. The method of claim 1, wherein step (c) comprises grinding away the via rack.

15. The method of claim 14, wherein:
    step (b) includes encapsulating the via rack in the molding compound; and
    step (c) further comprises grinding away the top of the molding compound.

16. The method of claim 1, wherein:
    the IC package is a three-dimensional (3D) package;
    the method further comprises assembling a top device comprising a top die on top of the packaged base device; and
    electrically connecting the top die to the top sides of the vias of the base device.

17. The method of claim 16, wherein:
    the top device is pre-packaged prior to assembly on top of the base device; and
    the resulting 3D package is a package-on-package (POP) type package.

18. The method of claim 17, wherein the assembly of the top device on top of the base device comprises:
    attaching an unpackaged top die to the top of the base device;
    forming conductive paths from the top die to the via top sides of the base device; and
    forming encapsulant around the conductive paths and the top die, wherein the resulting 3D package is a chip-scale-package (CSP) type package.

* * * * *